United States Patent [19]

Shirato

[11] Patent Number: 4,893,164
[45] Date of Patent: Jan. 9, 1990

[54] COMPLEMENTARY SEMICONDUCTOR DEVICE HAVING HIGH SWITCHING SPEED AND LATCHUP-FREE CAPABILITY

[75] Inventor: Takehide Shirato, Hiratsuka, Japan

[73] Assignee: Fujitsu Limited, Kanagawa, Japan

[21] Appl. No.: 348,132

[22] Filed: May 5, 1989

Related U.S. Application Data

[63] Continuation of Ser. No. 178,788, Apr. 1, 1988, abandoned, which is a continuation of Ser. No. 786,939, Oct. 11, 1985, abandoned.

[30] Foreign Application Priority Data

Oct. 13, 1984 [JP] Japan .................. 59-214617

[51] Int. Cl.$^4$ .......................................... H01L 27/02
[52] U.S. Cl. .................................... 357/42; 357/41; 357/48; 357/49; 357/50
[58] Field of Search .............. 357/41, 42, 44, 40, 357/48, 50, 43

[56] References Cited

U.S. PATENT DOCUMENTS

| | | | |
|---|---|---|---|
| 4,229,756 | 10/1980 | Sato et al. | 357/42 |
| 4,374,332 | 2/1983 | Inami et al. | 357/42 X |
| 4,516,313 | 5/1985 | Turi et al. | 357/42 X |
| 4,562,638 | 1/1986 | Schwabe et al. | 357/42 X |
| 4,616,243 | 10/1986 | Minato et al. | 357/42 X |
| 4,628,341 | 12/1986 | Thomas | 357/42 |
| 4,635,089 | 1/1987 | Shimbo | 357/42 |
| 4,750,027 | 6/1988 | Asami | 357/42 X |

FOREIGN PATENT DOCUMENTS

| | | | |
|---|---|---|---|
| 0091256 | 10/1983 | European Pat. Off. | |
| 0144248 | 12/1985 | European Pat. Off. | |
| 0178991 | 4/1986 | European Pat. Off. | 357/42 X |
| 57-143854 | 9/1982 | Japan . | |
| 58-21857 | 2/1983 | Japan | 357/42 X |
| 58-71650 | 4/1983 | Japan . | |
| 60-123055 | 7/1985 | Japan . | |
| 2104284 | 3/1983 | United Kingdom | 357/42 X |

Primary Examiner—William Mintel
Attorney, Agent, or Firm—Armstrong, Nikaido, Marmelstein, Kubovcik & Murray

[57] ABSTRACT

A complementary type semiconductor device comprises n-channel FETs and three types of p-channel FETs formed in an n$^-$-type semiconductor substrate. First p-channel FETs and n-channel FETs, both having deep well regions are used for input/output circuits disposed in peripheral areas of the substrate such that these transistors are connected directly to external circuits through bonding wires and the like. The transistors are seldom disturbed by undesirable noises from the external circuits, and the FETs are thus suitable for preventing the latchup effect of the circuits. The other second p-channel FETS have n-type sub-well regions beneath their gate insulator layers, and thus, have relatively small junction capacitances. These FETs are used in circuits needed for high switching speed and are disposed in the inner area of the substrate. By the selective adoption of the p-channel FETs of two types corresponding to the requirements of the associated circuits, a complementary semiconductor device having a highly reliable operation and a high switching speed is achieved.

5 Claims, 6 Drawing Sheets

COMPLEMENTARY SEMICONDUCTOR DEVICE HAVING HIGH SWITCHING SPEED AND LATCHUP-FREE CAPABILITY

This application is a continuation of application Ser. No. 178,788 filed Apr. 1, 1988, now abandoned, which is a continuation of application Ser. No. 786,939, filed Oct. 11, 1985, now abandoned.

BACKGROUND OF THE INVENTION

This invention relates to a complementary semiconductor device having a high operation speed and which is not affected by external electrical noise. More particularly, it relates to a complementary semiconductor integrated circuit (IC) device including two types of metal-insulator-semiconductor (MIS) field effect transistors (FETs) of one conductivity type, whereby the FETs of one type have a high switching speed, and those of the other type have a capability of suppressing the latchup effect of the device, each type of the FETs being selectively used depending on the needs for particular circuits.

Hereafter, a CMOS (complementary metal-oxide-semiconductor) FET is described as a representative device of the CMIS FETs.

As the demand for high packing density in semiconductor devices increases, the level of power consumption per device has been going up, raising a serious heat dissipation problem. In view of this, CMOS type ICs are very advantageous due to their particularly low power consumption. Generally, the CMOS IC is formed, for example, in an n-type silicon substrate of low dopant concentration, and comprises a p-channel type MOS FET and an n-type channel MOS FET. The former is formed directly in the substrate and the latter is formed in a p-type well region which is formed in the substrate. The well region is defined as a diffusion region formed in a semiconductor substrate, which has a higher dopant concentration than that of the substrate and a larger diffusion depth than that of the other diffusion regions formed in the same substrate.

The low power consumption of a CMOS device is realized by the operation of its basic inverter circuit composed of a pair of MOS FETs, namely an n-type channel MOS FET and a p-type channel MOS FET, wherein power source current flows only during a dynamic state, namely, the switching period from a high signal level to a low signal level or vice versa. In a static state or a standby state, one of the FETs is always in an OFF state, blocking the current flowing from source to ground.

In spite of the above advantage, the CMOS device has several inherent problems, such as a short channel effect, large junction capacitance, latchup effect, etc. When the structure of ICs becomes miniaturized, these problems become serious. These problems will be reviewed briefly in the following.

In order to increase the switching speed and the packing density of a semiconductor device, the gate channel length of the FETs formed in the device has been increasingly shortened. However, this shortened channel length tends to result in a "punch-through" effect. The effect is derived from extension of depletion regions around the source region and drain region of an MOS FET, generated by the application of a voltage to both regions. When both extended depletion regions come close to each other, a voltage breakdown might occur. This is referred to as a "punch-through" effect.

Generally, in a typical CMOS IC, a semiconductor substrate of low concentration is used in order to reduce the junction capacitance of an FET formed therein in order to attain switching speed. This prompts the extension of the depletion regions which leads to the occurrence of a punch-through effect. For preventing this problem, a CMOS IC having twin-tub well regions has been introduced, wherein an n-type channel FET and a p-type channel FET, for example, are formed respectively in a p-type well and an n-type well, the wells being formed in an n⁻-type substrate. Since a well region contains a dopant concentration higher than that of the substrate by approximately one order, the extension of the depletion regions around the diffusion regions of FETs is reduced to prevent the punch-through effect thereof. In addition, the latchup effect is also reduced by the presence of the well regions by reducing the resistivity of the substrate.

On the other hand, in the twin-tub structure, each diffusion region is facing each well region of a high dopant concentration, providing the respective FETs with large junction capacitances, resulting in the reduction of switching speed of the associated semiconductor device. In order to overcome this problem, a modified twin-tub structure of a CMOS having a higher switching speed has been proposed by the inventor herein in a Provisional Publication of Japanese Patent Application laid open to public inspection, TOKU-KAI-SHO 60-123055, July 1, 1985.

FIG. 1 is a cross-sectional view of an example of the modified structure of the CMOS FETs formed in an n⁻-type silicon substrate, having twin-tub CMOS transistors. In the silicon substrate 1, there is formed a p-type well region 2, having an n-channel MOS transistor n-Tr disposed therein. The transistor n-Tr comprises an n⁺-type source region 3, an n⁺-type drain region 4, a gate insulator 5 and a gate electrode 6. Further, in the n⁻-type silicon substrate 1, a p-channel MOS transistor p-Tr having a modified structure is formed. The p-Tr comprises a p⁺-type source region 7, a p⁺-type drain region 8, a gate insulator 5, a gate electrode 6 and a sub-well region 9. Also, in the substrate 1, there are formed, as illustrated in FIG. 1, field insulator layers 10 defining transistor regions therebetween, n⁺-type channel stoppers 11 and p⁺-type channel stoppers 12, and an n⁺-type contact 14 for the substrate 1 and a p⁺-type contact 15 for the well region 2.

It is the feature of the modified structure of the transistor p-Tr, that the n-type sub-well region 9 is formed beneath the gate insulator 5 such that a part of the p⁺-type source region 7 and the p⁺-type drain region 8 directly contact the n⁻-type substrate 1. Thus the junction capacitances of the source region 7 and the drain region 8 are substantially reduced from those of a conventional twin-tub CMOS FET, resulting in an improvement in the switching speed of the device. Furthermore, the sub-well region 9 acts adversely to the extension of the depletion regions around the source region 7 and the drain region 8, thereby reducing the punch-through effect. However, an MOS FET with the modified twin-tub structure has another disadvantage in that a latchup effect tends to occur more easily as compared with the prior art twin-tub CMOS transistor.

The latchup effect is described briefly referring to FIG. 2, which is a schematic cross-sectional view of an ordinary CMOS IC device. In FIG. 2, a circuit diagram of an inverter of the CMOS device and its equivalent circuit diagram are given, illustrating parasitic transistors and resistances created by elements of the IC device. In an $n^-$-type substrate $n_{sub}$, a p-type well region $p_{well}$ and a p-channel MOS FET p-Tr are formed. The p-type channel FET p-Tr has a p-type source region $S_p$, a p-type drain region $D_p$, a gate electrode $G_p$ and a gate insulator. In the p-type well region, an n-type channel FET n-Tr is formed having an n-type source region $S_n$, an n-type drain region $D_n$, a gate electrode $G_n$ and a gate insulator. Reference characters +Vdd, Vss, IN and OUT respectively denote a power source terminal, a ground terminal, an input terminal and an output terminal. In this configuration, a parasitic pnp transistors (pnpTr) is created by a combination of $S_p$, $n_{sub}$ and $p_{well}$ and a parasitic npn transistor (npnTr) is created by a combination of $S_n$, $p_{well}$, and $n_{sub}$. Between other terminals, parasitic resistances $R_1$ and $R_2$ are created by the inherent resistance of the parts of the associated devices. Along current paths, as shown in FIG. 2 with dotted lines, a thyristor is formed by these parasitic elements, causing a latchup effect. For example, if a large noise current from an external noise source, sufficient to turn the parasitic transistor npnTr "ON", flows through the drain region $D_n$, a source current starts flowing from the +Vdd terminal to the ground terminal Vss through the parasitic resistances $R_1$ and $R_2$. When the resulting voltage drop across the parasitic resistance $R_2$ exceeds the base voltage of the parasitic transistor pnpTr, the transistor becomes conductive, providing a current flow to the base of the parasitic transistor npnTr, resulting in an increase in the base current making the npnTr more conductive. This is a kind of positive feedback loop composed of the pnpTr and npnTr, bringing the parasitic thyristor into an "ON" state. As a result, a large current keeps flowing from the source terminal +Vdd to the ground terminal Vss, even though the exterior noise signal which triggered the current is eliminated, the current can be stopped only by turning off the power supply. If the current is not stopped, the whole semiconductor device will be damaged by the current. This phenomenon is referred to as a latchup effect. One of the effective methods for eliminating the latchup effect is to reduce the resistance of the parasitic resistance $R_2$.

With a modified CMOS FET described above, the sub-well region 9 having a deep diffusion region with a high dopant concentration, serves to reduce the latchup effect to some degree, however, its capability for suppressing the latchup effect is unsatisfactory in comparison with that of a conventional MOS FET formed in a complete well region. In other words, the parasitic resistance $R_2$ of the modified CMOS FET shown in FIG. 1 is not reduced satisfactorily, even though the transistor has a high switching speed as described above.

SUMMARY OF THE INVENTION

It is an object of the present invention to provide a complementary type semiconductor device having a high switching speed and which is not affected by external noise.

It is another object of the present invention to provide a complementary semiconductor device having a structure configuration which is easy to fabricate, resulting in the reduction of the fabrication cost thereof.

The above objects are achieved by a complementary semiconductor device having two types of p-type channel CMOS ICs. One type has a conventional well region of an n-type for preventing latchup effect triggered by external noise disturbance, and the other type has a sub-well region formed only selectively beneath its gate insulator, and has a comparatively high switching speed. The one type is used in input/output circuits disposed in the peripheral area of the substrate, since most of the FETs are connected to external circuits directly through connecting means such as bonding wires and lead terminals, and tend to be subject to external noise disturbance. The other type which has a high switching speed and has an almost latchup free capability, is used in inner circuits disposed in the inner portion of the substrate, where a high switching speed is required. Of course, n-type CMOS ICs having a p-type well are used for both the input/output circuits and the inner circuits.

It is apparent, that, in the above description, the polarity of the elements in the CMOS semiconductor device can be reversed.

These, together with other objects and advantages, which will be subsequently apparent, reside in the details of construction, as more fully hereinafter described and claimed, reference being had to the accompanying drawings forming a part hereof, wherein like numerals refer to like parts throughout.

BRIEF DESCRIPTION OF THE DRAWINGS

FIG. 6(a) is a cross-sectional view of a CMOS IC device, illustrating a fabrication step wherein a silicon nitride layer is formed on an $n^-$-type substrate.

FIG. 6(b) is a cross-sectional view of a CMOS IC device illustrating a fabrication step wherein the silicon nitride layer is etched to form a pattern of field oxide layer regions.

FIG. 6(c) is a cross-sectional view of a CMOS IC device, illustrating a fabrication step wherein boron ions are implanted into a p-type well region.

FIG. 6(d) is a cross-sectional view of a CMOS IC device, illustrating a fabrication step wherein phosphorus ions are implanted into n-type well regions.

FIG. 6(e) is a cross-sectional view of a CMOS IC device, illustrating a fabrication step wherein n-type and p-type well regions are formed.

FIG. 6(f) is a cross-sectional view of a CMOS IC device, illustrating a fabrication step wherein boron ions are implanted into p-type channel stopper regions.

FIG. 6(g) is a cross-sectional view of a CMOS IC device, illustrating a fabrication step wherein phosphorus ions are implanted into n-type channel stopper regions.

FIG. 6(h) is a cross-sectional view of a CMOS IC device, illustrating a fabrication step wherein field oxide layers are formed.

FIG. 6(i) is a cross-sectional view of a CMOS IC device, illustrating a fabrication step wherein gate electrodes and gate insulator layers thereunder are formed by etching.

FIG. 6(j) is a cross-sectional view of a CMOS IC device, illustrating a fabrication step wherein ion implantations for diffusion regions of the transistors and contact regions to the well regions are performed and thereafter the entire substrate is covered by a silicon dioxide layer.

FIG. 6(k) is a cross-sectional view of a CMOS IC device, illustrating a fabrication step wherein PSG layers, contact regions, and wirings are completed on the substrate to finish the fabrication steps of the complementary semiconductor device.

DETAILED DESCRIPTION OF THE PREFERRED EMBODIMENTS

Figure 1:
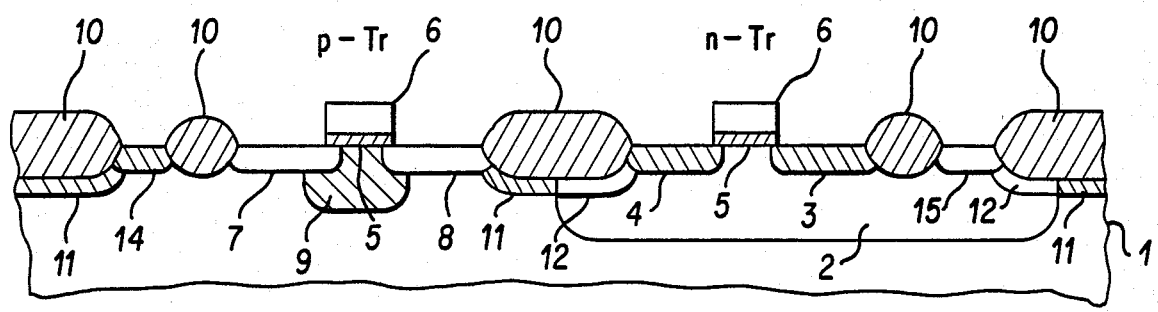
FIG. 1 is a cross-sectional view of a prior art CMOS IC having twin-tub CMOS transistors comprising a p-type channel FET of a modified structure formed in an $n^-$-type silicon substrate.
Figure 2:
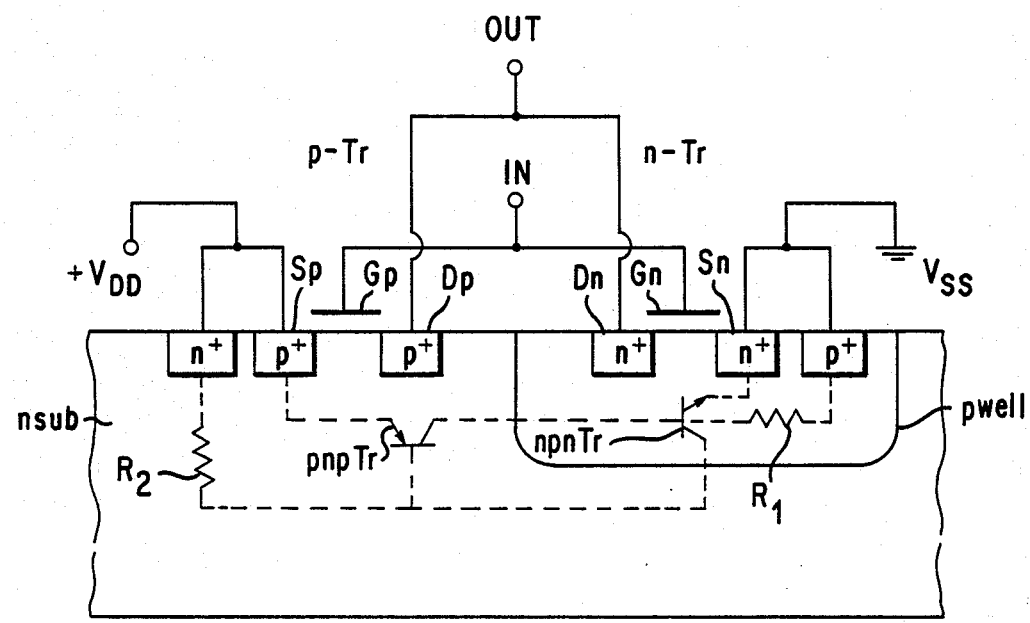
FIG. 2 is a cross-sectional view of a prior art CMOS IC device having conventional FETs, illustrating its structure and parasitic elements formed inside the device, for the purpose of explaining a latchup effect.
Figure 3A:
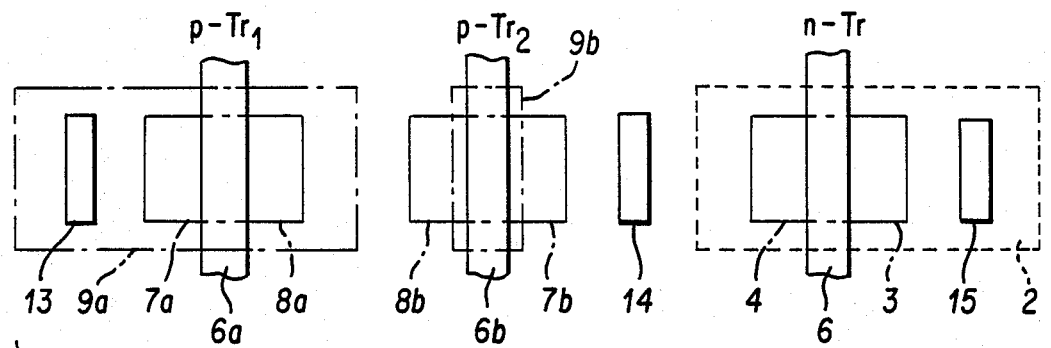
FIG. 3(a) is a partial plan view.
Figure 3B:
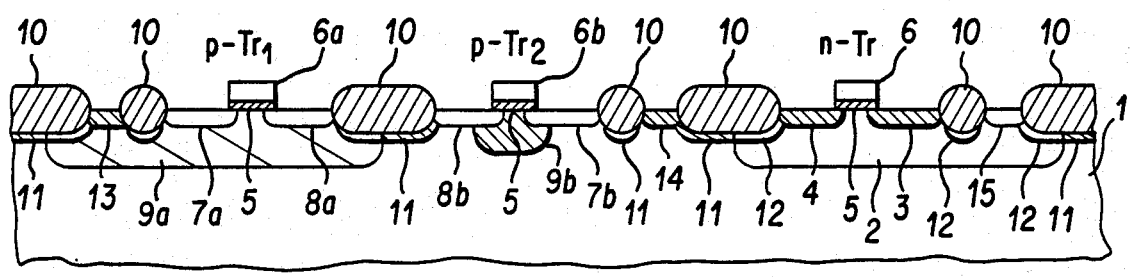
FIG. 3(b) is a partial cross-sectional view of a first embodiment of the present invention, illustrating three kinds of MOS FETs employed in the circuits of the semiconductor device by the present invention.

FIGS. 3(a) and 3(b) are respectively a partial plan view and cross-sectional view of the first embodiment of the present invention, illustrating a semiconductor device including three kinds of MOS FETs n-Tr, p-Tr$_1$, and p-Tr$_2$. These FETs are well-known and their structure and fabricating method already has been disclosed in a reference of TOKU-KAI-SHO No. 60-123055, a Provisional Publication of a Japanese Patent Application laid open to public inspection on July 1, 1985 by the inventor. Therefore, only a brief description of the structure of these transistors is given with reference to FIGS. 3(a) and 3(b).

The device is formed in an n$^-$-type silicon substrate 1 having a dopant concentration of approximately $5 \times 10^{14}$ cm$^{-3}$. Field oxide layers 10 of silicon dioxide (SiO$_2$) are formed on the surface of the substrate 1 defining transistor regions therebetween.

The n-channel type MOS transistor n-Tr is formed in an ordinary p$^-$-type well region 2 having dopant concentration of approximately $10^{16}$ cm$^{-3}$ and a depth of three to four $\mu$m. The transistor comprises an n$^+$-type source region 3 and n$^+$-type drain region 4, both having a dopant concentration of approximately $10^{20}$ cm$^{-3}$ and a depth of approximately 3000 Å, a gate insulator 5 of silicon dioxide having a thickness of approximately 250 Å, and a gate electrode 6 of polycrystalline silicon. Two p$^+$-type channel stoppers 12 having a dopant concentration of approximately $10^{17}$ cm$^{-3}$ are disposed in both edge areas of the well region 2 in which a p$^+$-type well contact region 15 having a dopant concentration of approximately $10^{20}$ cm$^{-3}$ and a depth of approximately 3000 Å is formed for the connection of the p-type well region 2 to another circuit.

The first p-channel type MOS FET p-Tr$_1$ is a conventional one, usually employed in a twin-tub CMOS configuration. It is formed in an n-type well region 9a having a dopant concentration of approximately $5 \times 10^{16}$ cm$^{-3}$ and a depth of three to four $\mu$m. The transistor p-Tr$_1$ comprises a p$^+$-type source region 7a and p$^+$-type drain region 8a having a dopant concentration of approximately $10^{20}$ cm$^{-3}$ and a depth of approximately 3000 Å respectively, a gate insulator 5 having a thickness of approximately 250 Å and a gate electrode 6a of polycrystalline silicon. The n-type well region has an n$^+$-type well contact 13 having a dopant concentration of approximately $10^{20}$ cm$^{-3}$ and a depth of approximately 3000 Å for the connection of the well 9a to another circuit.

The second p-type channel transistor p-Tr$_2$ is disclosed in the Japanese patent application. As shown in FIG. 3(b), the transistor has a narrow n-type sub-well region 9b beneath its gate insulator 5. The transistor p-Tr$_2$ comprises a p$^{30}$-type source region 7b and a drain region 8b, having a dopant concentration of $10^{20}$ cm$^{-3}$ and a depth of approximately 3000 Å respectively, a gate insulator 5 of silicon dioxide, having a thickness of approximately 250 Å, and a gate electrode 6b of polycrystalline silicon crystal. The n-type sub-well region 9b has a dopant concentration of approximately $5 \times 10^{16}$ cm$^{-3}$ and a depth of approximately three to four $\mu$m and is formed beneath the gate insulator 5. The sub-well region 9b has a narrow width so that parts of the source region 7b and drain region 8b directly contact the n$^-$-type substrate 1, resulting in a relatively small junction capacitance in the transistor p-Tr$_2$. This serves to increase the switching speed of the transistor p-Tr$_2$. In addition, the n-type sub-well region 9b serves to reduce the punch-through effect of the transistor p-Tr$_2$, making it possible to shorten the length of the gate electrode 6b of the transistor p-Tr$_2$. A pair of n$^+$-type channel stoppers 11 having a dopant concentration of approximately $10^{17}$ cm$^{-3}$ are disposed beneath the edge portion of the field oxide layers 10. An n$^+$-type substrate contact region 14 having a dopant concentration of approximately $10^{20}$ cm$^{-3}$ and a depth of approximately 3000 Å is formed in the substrate 1 to connect the substrate 1 to another circuit.

In the above structure of the device, the n-type well region 9a of the first p-type channel transistor p-Tr$_1$ serves to reduce the resistivity of the substrate 1, namely, the parasitic resistance $R_2$, which results in suppressing the latchup effect of the device. Furthermore, the well region makes it possible to omit the channel stopper 11 from the transistor p-Tr$_1$ because the well 9a contains a large number of dopants and has a deep diffusion depth sufficient to stop the leakage of signals from the transistor to other adjacent circuits.

Figure 4A:
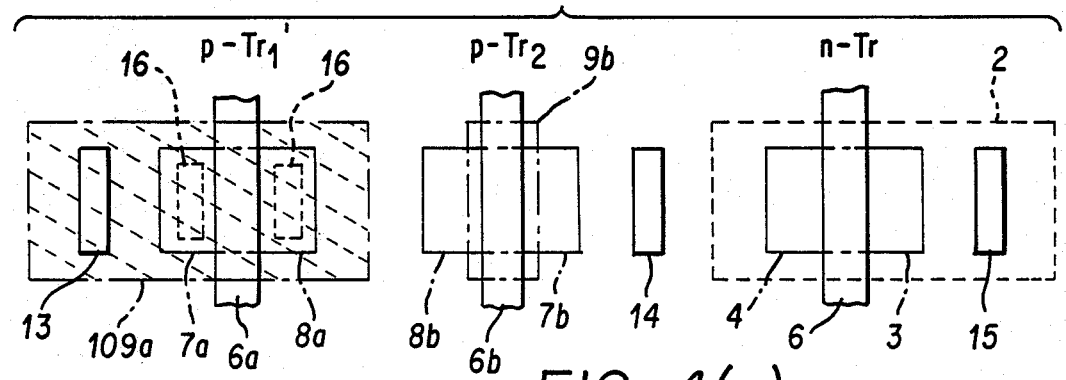
FIG. 4(a) is a partial plan view.
Figure 4B:
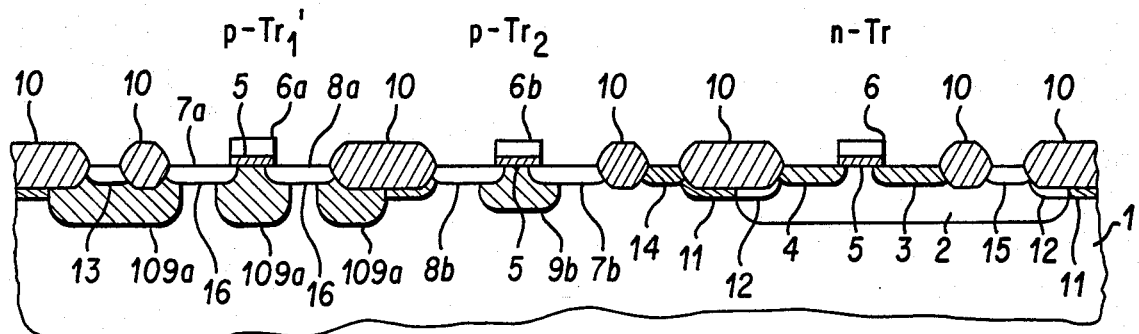
FIG. 4(b) is a partial cross-sectional view of a second embodiment of the present invention, illustrating three kinds of MOS FETs employed in the circuits of the semiconductor device.

Next, the second embodiment is described referring to the drawings. FIG. 4(a) is a plan view and FIG. 4(b) is a cross-sectional view of a part of a semiconductor device. The device includes three types of MOS FETs: an n-type channel MOS FET n-Tr, a p-type channel MOS FET p-Tr$_1$', and p-Tr$_2$. Like reference numerals denote like parts throughout FIG. 3(a), FIG. 3(b), FIG. 4(a), and FIG. 4(b). The difference between the first embodiment and the second embodiment is that in the second embodiment, the transistor p-Tr$_1$ is replaced by a transistor p-Tr$_1$'. The transistors n-Tr and p-Tr$_2$ are respectively the same as those used in the first embodiment. The transistor p-Tr$_1$' is a modification of the transistor p-Tr$_1$ of the first embodiment, having two rectangular windows 16 (also referred to as non-doped portions or empty portions) in an n-type well region 109a as shown in FIG. 4(a). Through these windows 16, a p$^+$-type source region 7a and a p$^+$-type drain region 8a directly contact an n$^{31}$-type substrate 1, thereby reducing each junction capacitance by a value in proportion to the area of the windows 16. This contributes to increasing the switching speed of the relevant transistors. The reduction of the resistance of the substrate 1, however, remains almost unchanged as compared with that of the first embodiment, thus preventing a latchup effect. In addition, channel stoppers for the first n-type well region can also be omitted.

Figure 5:
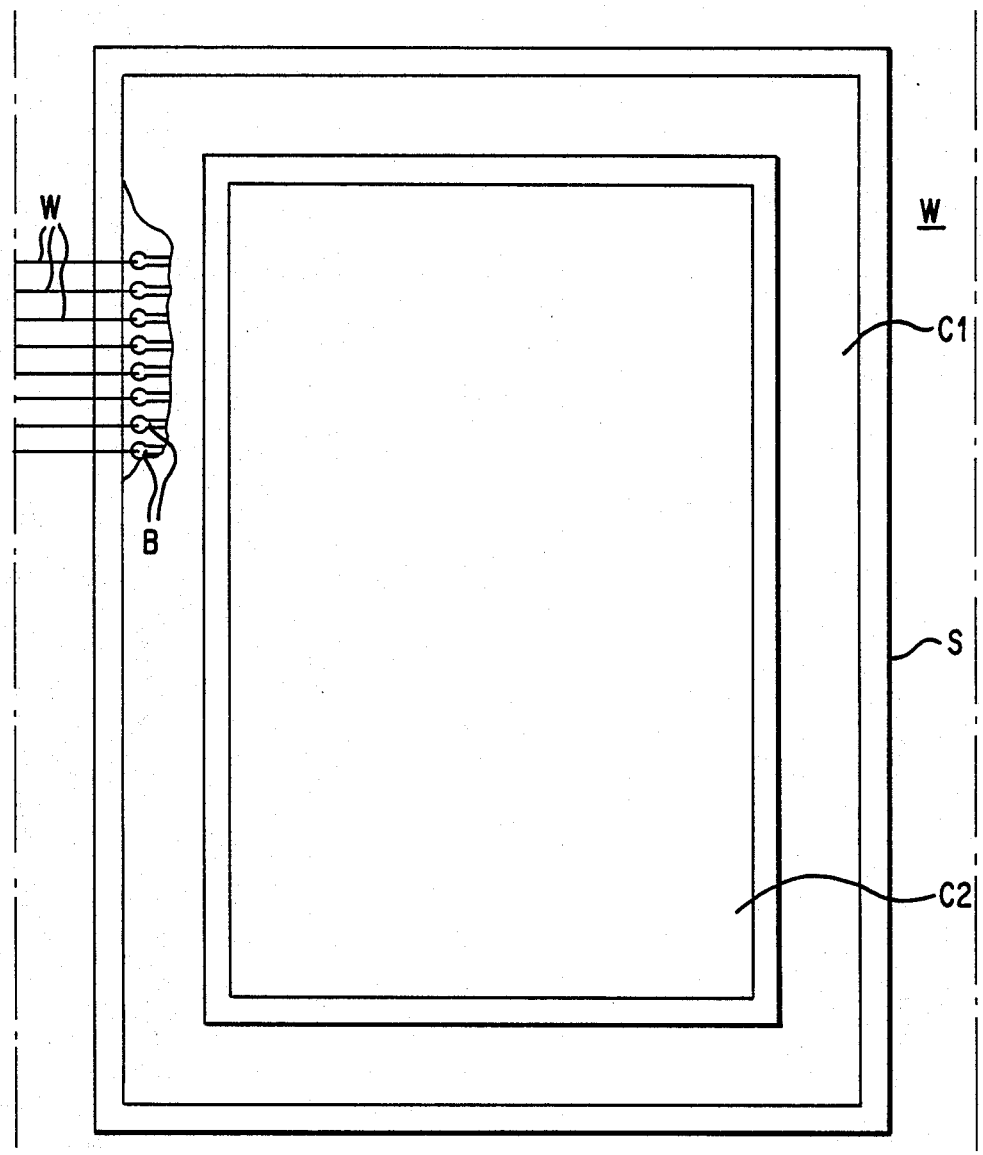
FIG. 5 is a schematic cross-sectional view of a CMOS IC device, illustrating a peripheral area and an inner area on the substrate of the device.

Since in the p-type channel FETs described above, $p-Tr_1$, $p-Tr_1'$, and $p-Tr_2$, each have their own featured merits, it is advantageous to apply these transistors corresponding to the requirements for the circuits of a semiconductor device such as a semiconductor IC logic device. For example, as shown in a schematic plan view of FIG. 5, a semiconductor substrate of the device S is divided into two areas: a peripheral area $C_1$ and inner area $C_2$. In the peripheral area $C_1$, there are arranged several input/output circuits which tend to be subject to disturbance from external noise sources. It is advantageous to employ n-type channel transistors n-Tr and first p-type channel transistors $p-Tr_1$ and/or $p-Tr_1'$ in the input/output circuits because these transistors have deep well regions sufficient to suppress the occurrence of a latchup effect. Most of these n-type channel and first type p-type channel transistors are connected to outside circuits of the semiconductor device (chip) through bonding wires W bonded to bonding terminals B formed on the substrate S (partially shown), lead terminals (not shown), and the like. Although the transistors are frequently subject to external noise signals, they can suppress the latchup effect triggered by the noise signals in the manner described above.

In the inner area $C_2$ of the substrate S, where a large number of basic cells of high operating speed such as gate array cells are arranged, the second p-type channel FETs $pTr_2$ having sub-well regions are used, because the transistors $p-Tr_2$ have a smaller junction capacitance suitable for high speed switching operations.

In summary, by the use of three types of FETs corresponding to the requirements of the associated circuits, a complementary semiconductor device having highly reliable operation and high switching speed is obtained. Of course, the polarity stated in the above description can be reversed.

Now, a fabrication method of a complementary semiconductor device according to the present invention is described, taking the first embodiment shown in FIG. 3 as an example, referring to schematic partial cross-sectional views of FIGS. 6(a) to (k). In the figures of FIG. 6, dotted lines beneath the surface line of the substrate 1 represent dopant ions just implanted therein. Reference letters B+, P+ and As+ represent respectively boron, phosphorus and arsenic ions.

The fabrication process employed in the present invention, such as etching, insulator layer formation, and photolithography, can be performed by conventional techniques well known in the art. Therefore, detailed description regarding these techniques is omitted in the following description. In FIG. 3 and FIG. 6(a) to FIG. 6(k), like reference numerals denote like parts.

Figure 6A:
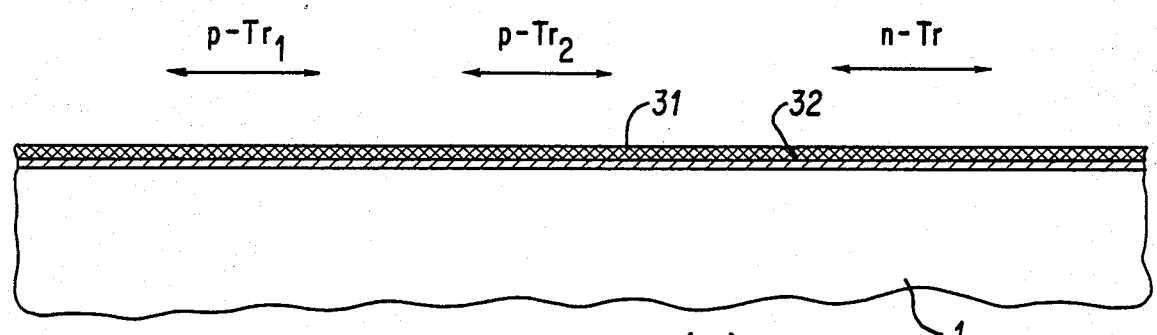
FIGS. 6(a) to (k) are cross-sectional views of a CMOS IC device, illustrating fabrication steps of the first embodiment of the present invention, whereby.

FIG. 6(a) illustrates the formation step of a silicon nitride ($Si_3N_4$) film 31 on an n⁻-type silicon substrate 1 having dopant concentration of approximately $5 \times 10^{14}$ cm⁻³. First, a thin film 32 of silicon dioxide having a thickness of approximately 500 Å is formed on the silicon substrate 1, utilizing a conventional oxidizing method such as thermal oxidation. Subsequently, a silicon nitride ($Si_3N_4$) film of approximately 1000 Å thick is deposited by a conventional chemical vapor deposition (CVD) method on the silicon dioxide ($SiO_2$) layer 32. In the upper portion of FIG. 6(a), the regions wherein each transistors are to be formed are indicated by double-headed arrow lines.

Figure 6B:
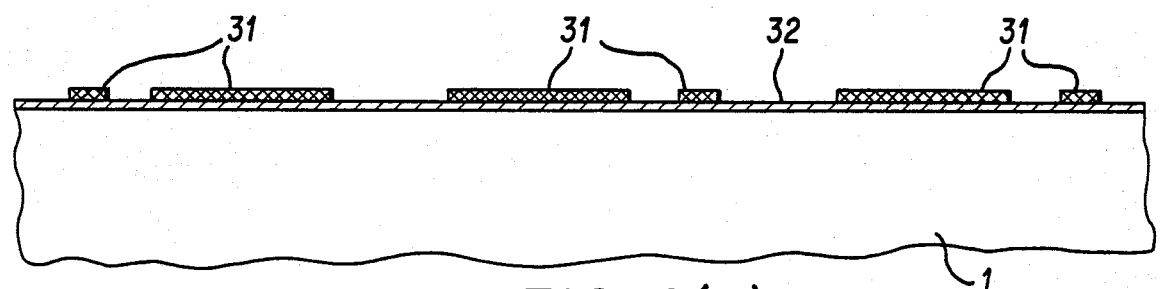

The silicon nitride ($Si_3N_4$) layer 31 is patterned by conventional dry etching, and the silicon substrate 1 is selectively exposed to define the regions for field oxide layers 10 to be later formed as shown in FIG. 6(b).

Figure 6C:
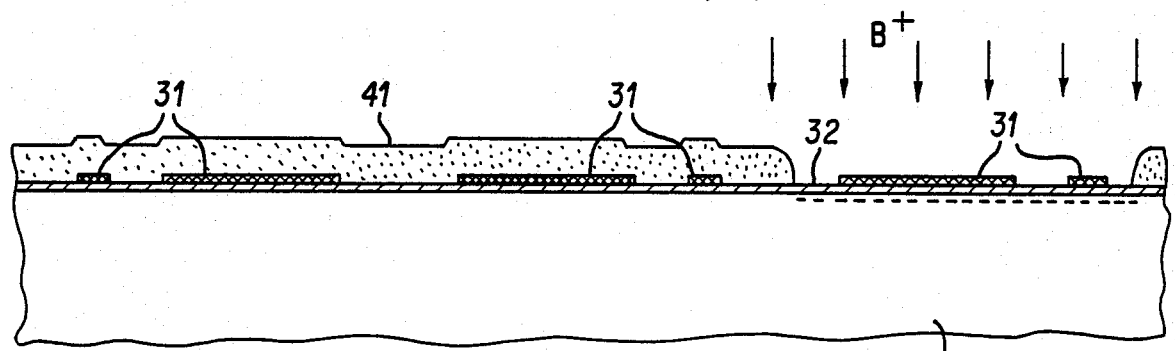

Thereafter, as shown in FIG. 6(c), the substrate is masked selectively by a conventional photoresist layer 41 and a portion of the substrate 1, wherein p-type well region 2 is to be formed, is exposed. Then boron (B) ions of approximately $10^{13}$ cm⁻² dopant density are selectively implanted into the exposed portion with an accelerating voltage of approximately 160 KeV, penetrating the thin silicon dioxide ($SiO_2$) layer 32 and silicon nitride ($Si_3N_4$) layer 31.

Figure 6D:
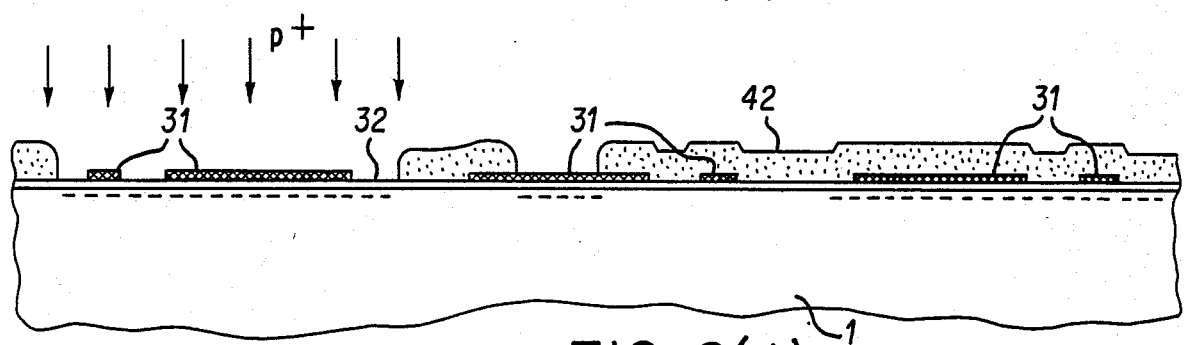

After eliminating the photoresist layer 41, as shown in FIG. 6(d), another photoresist layer 42 is formed covering the entire substrate, being followed by a patterning thereof to form a mask for the formation of n-type well regions. Thereafter, phosphorus (P) ions are implanted in the unmasked portion of the substrate 1 wherein n-type well regions 9a and 9b are to be formed, with a dopant density of approximately 4 to $5 \times 10^{12}$ cm⁻² at an acceleration energy of approximately 180 KeV.

Figure 6E:
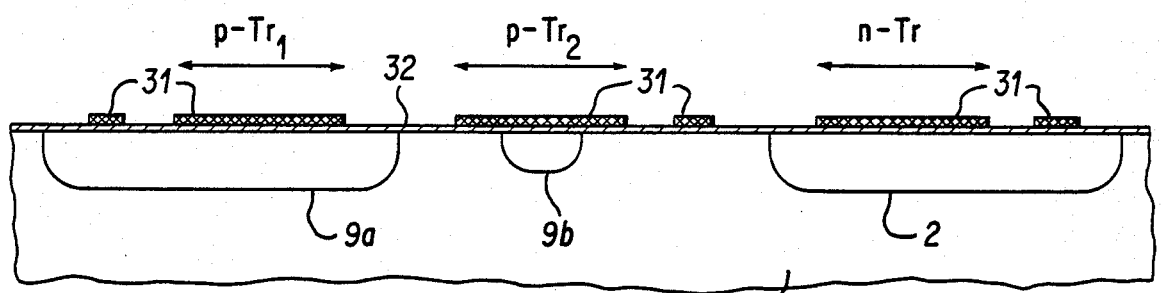

After removing the photoresist layer 42 by a conventional ashing process, the substrate is put into a diffusion furnace (not shown) and the implanted ions are diffused to form respective diffusion regions (well) 2, 9a, and 9b (shown in FIG. 6(e)) by maintaining the substrate at approximately 1200° C. for three hours.

Figure 6F:
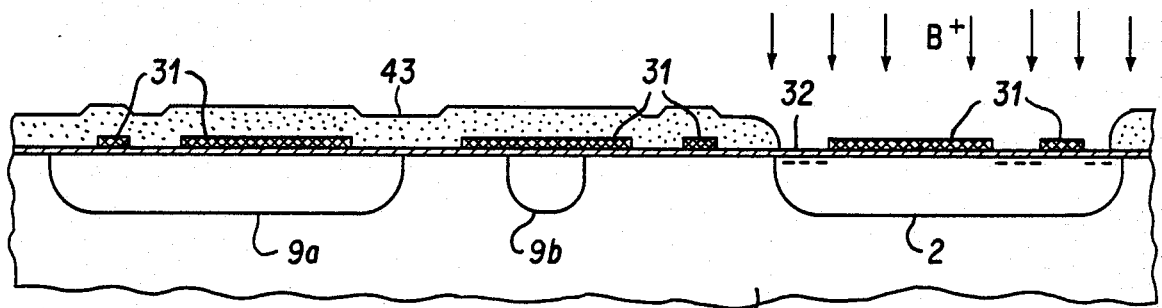

Following the diffusion process, the substrate 1 is covered by a conventional photoresist layer 43 which is subsequently patterned to expose portions of p-type channel stopper regions 12 to be formed in the p-type well region 2. Then, boron (B) ions are implanted into the exposed portions with a dopant density of approximately $5 \times 10^{13}$ cm⁻² at an accelerating energy of approximately 25 KeV, as shown in FIG. 6(f).

Figure 6G:
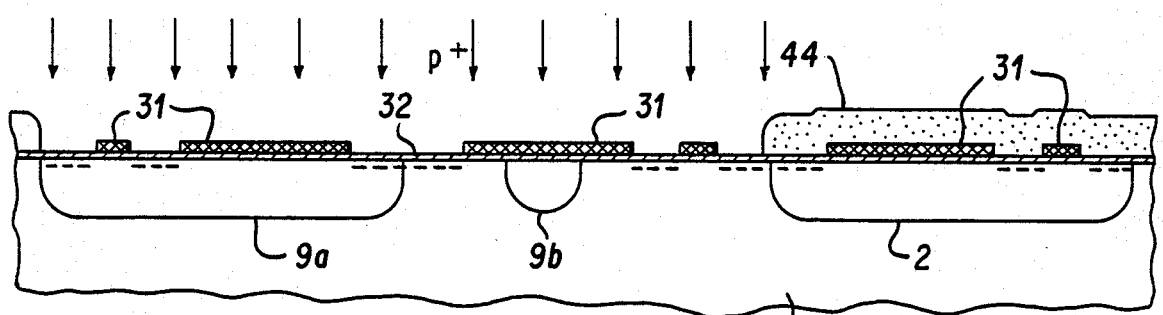

The photoresist layer 43 is eliminated by a conventional ashing process, and a photoresist layer 44 is newly formed covering the entire substrate 1. This is followed by a patterning to form a mask, as shown in FIG. 6(g), selectively exposing the portion of the substrate 1 where the n-type channel stopper regions 11 are to be formed for the second p-type channel transistor $p-Tr_2$. A phosphorus (P) ion implantation of a dopant density of approximately $3 \times 10^{12}$ cm⁻² with an accelerating energy of approximately 60 KeV is performed, utilizing the above photoresist mask.

Figure 6H:
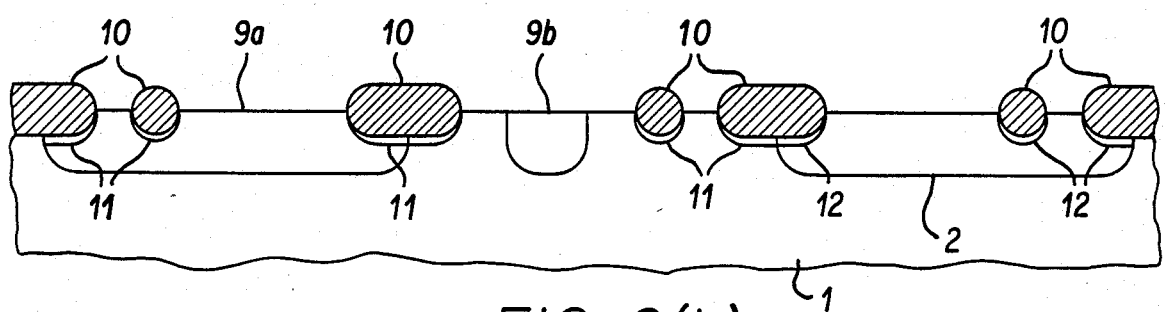

The photoresist layer 44 is removed by a conventional ashing process, and field oxide layers 10 of approximately 6000 Å in thickness are formed by a conventional thermal oxidation method, as shown in FIG. 6(h), on the exposed portions of the substrate 1 without the silicon nitride ($Si_3N_4$) layers 31. Simultaneously, the dopant ions implanted in the substrate 1, namely boron (B) ions and phosphorus (P) ions are diffused to form respective p-type channel stoppers 12 and n-type channel stoppers 11. As for the n-type well region 9a, from a practical view point, there is no need to form channel stopper regions therein because the dopant concentration of the n-type well region 9a is sufficiently high. Subsequently, the entire surface of the substrate 1 is etched by conventional wet etching to expose the surface of the substrate 1 by etching off the silicon nitride ($Si_3N_4$) layers 31 and silicon dioxide ($SiO_2$) layers 32.

The surface of the substrate 1 is exposed except the remaining thick field oxide layers 10, as shown in FIG. 6(h).

Figure 6I:
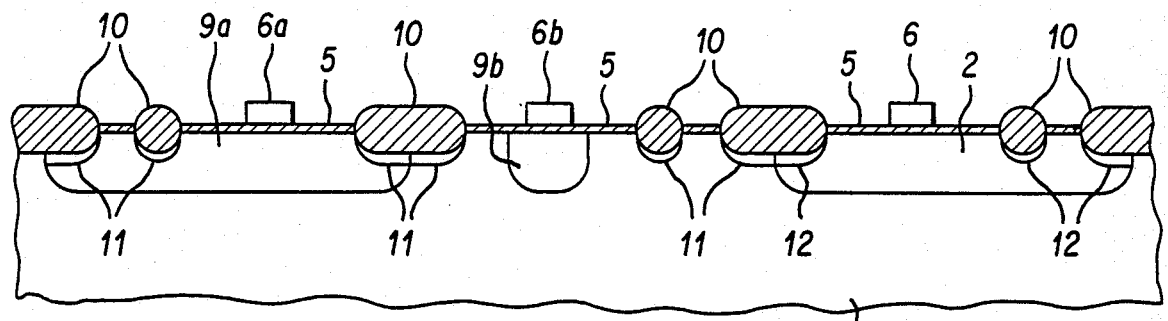

Thereafter, the step for forming gate electrodes 6, 6a, and 6b is performed. A silicon dioxide (SiO$_2$) layer 5 having a thickness of approximately 250 Å is formed on the substrate 1 by a conventional thermal oxidation process, and is followed by the formation process of a polycrystalline silicon layer 6 of approximately 4000 to 5000 Å in thickness by a conventional CVD over the silicon dioxide (SiO$_2$) layer 5. The layer 6 is heavily doped with n-type dopants by conventional gas diffusion or ion-implantation. The doped polycrystalline silicon layer 6 is selectively etched by a conventional photolithographic technology and reactive ion-etching to form gate electrodes 6, 6a, and 6b, as shown in FIG. 6(i).

Figure 6J:
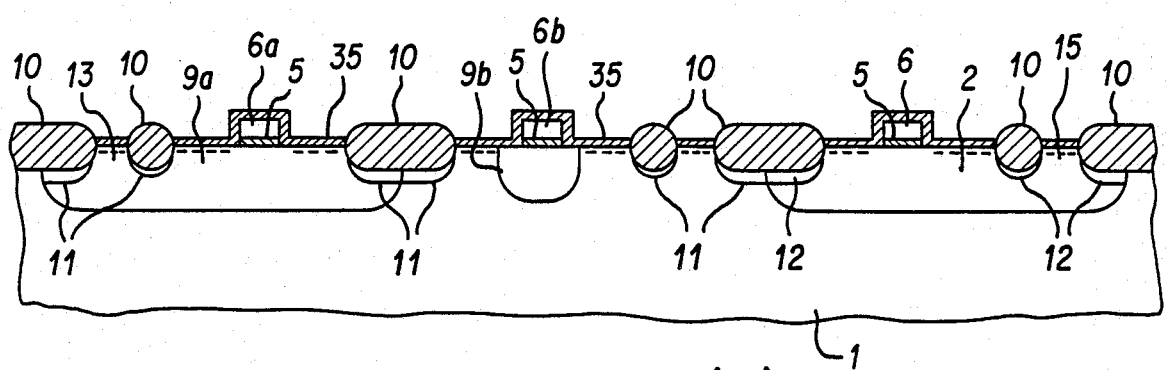
Figure 6K:
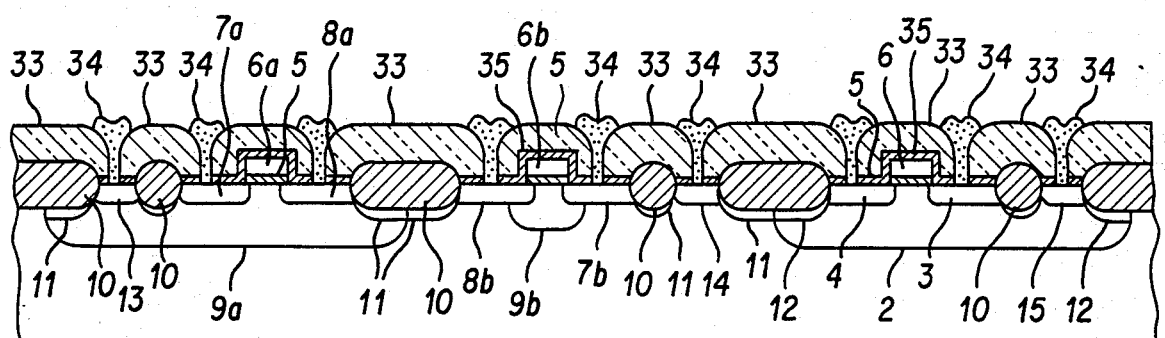

Subsequently, as shown in FIG. 6(j), dopant ions are implanted into the substrate 1 by conventional processes. At first, the transistor regions for p-type channel transistors and p-type well contact region 15 are covered and those for the n-type channel transistors and the n-type contact region 13 are exposed by a photoresist mask (not shown), and arsenic (As) ions with a dopant density of approximately $4 \times 10^{15}$ cm$^{-2}$ are implanted with an accelerating energy of 80 KeV into the exposed portions of the substrate 1 through the silicon dioxide (SiO$_2$) layer 5. The photoresist layer is removed by a conventional ashing process, the exposed portions of the silicon dioxide (SiO$_2$) layer 5, out of the gate electrodes, are etched off by a conventional etching, and a new silicon dioxide (SiO$_2$) layer 35 of approximately 500 Å in thickness is formed by a conventional thermal oxidation. Then a new photoresist layer (not shown) is formed to cover the regions of n-type channel transistors and n-type contact 13, exposing the regions for p-type channel transistor and p-type contact region 15. Then two steps of ion implantation of boron (B), having a dopant density of approximately $6.5 \times 10^{11}$ cm$^{-2}$ with 180 KeV energy and a dopant density of approximately $1 \times 10^{15}$ cm$^{-2}$ with 25 KeV energy are successively effected onto the substrate 1. Thus all the ions have been implanted into the substrate 1. After removing the photoresist mask, these implanted arsenic (As) ions and boron (B) ions are activated by a conventional diffusion technique to form respective diffusion regions in the substrate 1 as shown in FIG. 6(k). These regions are p-type diffusion regions 7a, 7b, 8a, 8b, and 15, and n-type diffusion regions 3, 4, 13 and 14.

Finally, the entire surface of the substrate 1 is coated with a phospho-silicate glass (PSG) insulator layer 33, being followed by the opening of windows for contact with the respective source, drain and contact regions formed in the substrate 1, and the formation of aluminum wiring 34 over the PSG layer 33 as shown in FIG. 6(k). These final processes are all conventional so that a detailed description thereof has been omitted. The above fabrication method is only an example for fabricating the first embodiment.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than foregoing description, and all changes which come within the meaning and range of equivalency of the claims re therefore, to be embraced therein.

I claim:

1. A complementary semiconductor device having a high speed operating capability and a high integration density, formed in a semiconductor substrate having a first conductivity type, on which an input/output circuit operatively connectable to an external circuit is formed in a peripheral area thereof, and an inner circuit operatively connected to said input/output circuit is formed in an inner area thereof, said complementary semiconductor device comprising:
   a first well region of a second conductivity type formed in said semiconductor substrate, said first well region having a higher dopant concentration than that of said semiconductor substrate wherein said first conductivity type is opposite to said second conductivity type;
   a second well region of said first conductivity type formed in said substrate, said second well region having a higher dopant concentration than that of said substrate;
   an impurity region of said first conductivity type formed in said substrate, said impurity region having a higher dopant concentration than that of said semiconductor substrate;
   a first conductivity type channel MIS field effect transistor formed in said first well region having a source region, a drain region, and a channel region, all of which are formed in said first well region;
   a second conductivity type channel MIS field effect transistor of a first type formed in said second well region, and having a source region, a drain region and a channel region, all of which are formed in said second well region; and
   a second conductivity type channel MIS field effect transistor of a second type formed in said substrate and having a source region and drain region formed directly in said substrate and a channel region substantially located at said impurity region, wherein said second conductivity type channel MIS field effect transistor of said first type and said first conductivity type channel MIS field effect transistor are disposed in said input/output circuit of said complementary device, and wherein said second conductivity type channel MIS field effect transistor of said second type and said first conductivity type channel MIS field effect transistor are selectively disposed in said inner circuit.

2. A complementary semiconductor device having a high speed operating capability and a high integration density, formed in a semiconductor substrate having a first conductivity type, on which an input/output circuit operatively connectable to an external circuit is formed in a peripheral area thereof, and an inner circuit operatively connected to said input/output circuit is formed in an inner area thereof, said complementary semiconductor device, comprising:
   a field insulation layer formed over a surface of said semiconductor substrate for defining transistor regions in which MIS field effect transistors are formed and electrically separating said transistors from each other by surrounding each of said MIS field effect transistor regions;
   a well region of a second conductivity type formed in said semiconductor substrate, said well region having a higher dopant concentration than that of said semiconductor substrate, and extending beneath said field insulation layer, wherein said first conductivity type is opposite to said second conductivity type;

a first impurity region of said first conductivity type formed in said semiconductor substrate, and extending beneath a part of said field insulation layer, said first impurity region having a higher dopant concentration than that of said substrate including a plurality of empty portions selectively formed in said first impurity region, wherein said first impurity region is absent from said plurality of empty portions;

a second impurity region of said first conductivity type formed in said substrate, said second impurity region having a higher dopant concentration than that of said semiconductor substrate;

a first conductivity type channel MIS field effect transistor formed in said well region of said second conductivity type and having a source region, a drain region, and a channel region, all of which are formed in said well region;

a second conductivity type channel MIS field effect translator of a first type formed in said semiconductor substrate, and having a source region, drain region and channel region which are formed in said first impurity region, wherein at least a portion of each of said drain region and said source region formed in at least one empty portion in said first impurity region to thereby have said portion of each of said drain region and said source region directly contact said semiconductor substrate for increasing switching speed of said second conductivity type channel MIS field effect transistor of a first type;

a second conductivity type channel MIS field effect transistor of a second type formed in said substrate and having a source region and drain region formed directly in said substrate and a channel region substantially located at said second impurity region to thereby increase switching speed of said second conductivity type channel MIS field effect transistor of a second type, wherein said second conductivity type channel MIS field effect transistor of said first type and said first conductivity type channel MIS field effect transistor are selectively disposed in said input/output circuit, and said second conductivity type channel MIS field effect transistor of said second type and said first conductivity type channel MIS field effect transistor are disposed selectively in said inner circuit.

3. A complementary semiconductor device of one of claims 1 or 2, wherein said second conductivity type channel MIS field effect transistor of the second type has a lower junction capacitance than that of said second conductivity type channel MIS field effect transistor of said first type.

4. A complementary semiconductor device of one of claims 1 or 2, wherein the MIS field effect transistors include MOS field effect transistors.

5. A complementary semiconductor device of claim 2, wherein said plurality of empty - portions are rectangular substantially in plan view.

* * * * *